United States Patent [19]

Ema

[11] Patent Number: 4,931,845
[45] Date of Patent: Jun. 5, 1990

[54] SEMICONDUCTOR MEMORY DEVICE HAVING AN OHMIC CONTACT BETWEEN AN ALUMINUM-SILICON ALLOY METALLIZATION FILM AND A SILICON SUBSTRATE

[75] Inventor: Taiji Ema, Kawasaki, Japan
[73] Assignee: Fujitsu Limited, Kawasaki, Japan
[21] Appl. No.: 264,857
[22] Filed: Oct. 31, 1988

[30] Foreign Application Priority Data

Nov. 5, 1987 [JP] Japan .................. 62-278286

[51] Int. Cl.$^5$ ............ H01L 23/48; H01L 29/04; H01L 29/78; H01L 27/02
[52] U.S. Cl. .......................... 357/71; 357/59; 357/23.6; 357/41
[58] Field of Search .......... 357/71, 71 S, 59 I, 357/23.6, 41

[56] References Cited

U.S. PATENT DOCUMENTS

| | | | |
|---|---|---|---|
| 4,042,953 | 8/1977 | Hall | 357/59 |
| 4,569,122 | 2/1986 | Chan | 357/59 |
| 4,604,641 | 8/1986 | Konishi | 357/59 |
| 4,845,544 | 7/1989 | Shimizu | 357/45 |

FOREIGN PATENT DOCUMENTS

| | | | |
|---|---|---|---|
| 66465 | 4/1985 | Japan | 357/71 |
| 79746 | 5/1985 | Japan | 357/71 |

*Primary Examiner*—Rolf Hille
*Assistant Examiner*—Robert P. Limanek
*Attorney, Agent, or Firm*—Staas & Halsey

[57] ABSTRACT

A semiconductor memory device includes a memory cell portion and a peripheral circuit portion which are provided on a silicon substrate. The peripheral circuit portion includes an insulation film having a contact hole formed on the silicon substrate, a barrier layer formed in the contact hole having a layer structure which is the same as that of a metallization film provided in the memory cell portion and which is formed at the same time as forming the first metallization film. The above layer structure includes a polysilicon film and a metal silicide film. A metallization film of an alloy of aluminum and silicon overlies the barrier layer in the contact hole.

10 Claims, 3 Drawing Sheets

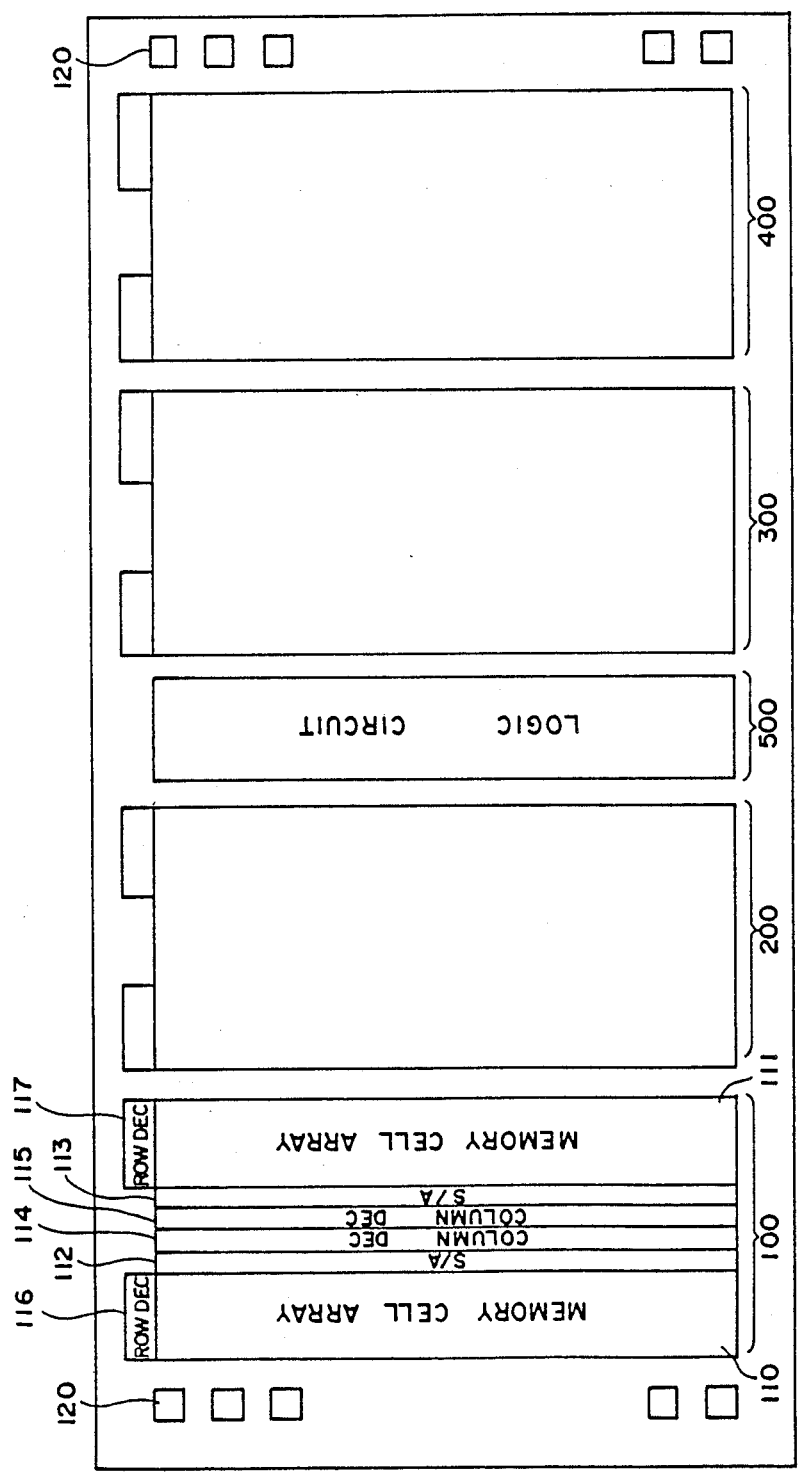

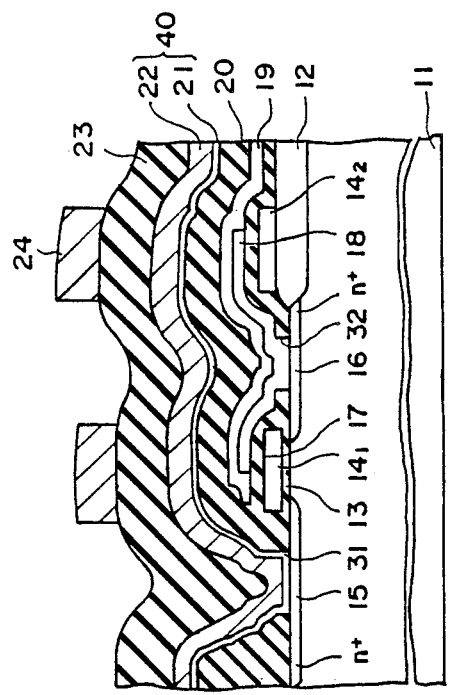
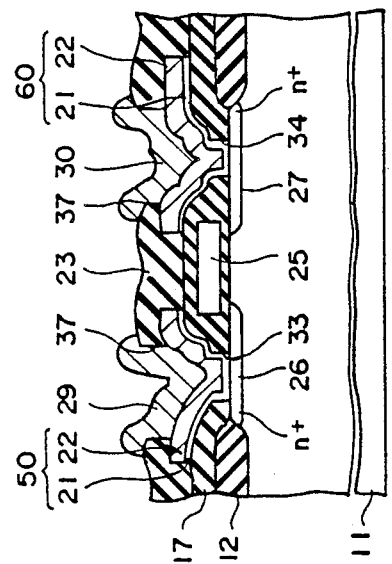

SEMICONDUCTOR MEMORY DEVICE HAVING AN OHMIC CONTACT BETWEEN AN ALUMINUM-SILICON ALLOY METALLIZATION FILM AND A SILICON SUBSTRATE

BACKGROUND OF THE INVENTION

The present invention generally relates to a semiconductor memory circuit having an ohmic contact between an aluminum-silicon alloy metallization film and a silicon substrate.

Generally, an alloy of aluminum and silicon is used for forming source and drain electrodes of a transistor provided in a peripheral circuit portion (including a sense amplifier, an address decoder, a logic circuit and the like) of a semiconductor memory device. The source and drain electrodes are in contact with respective active layers formed in a silicon substrate through respective contact holes. Such a contact is an ohmic contact. Generally, aluminum-silicon alloy makes a low-resistance ohmic contact with the silicon substrate.

It is known that excessive silicon atoms contained in an aluminum-silicon alloy film may precipitate in a contact hole due to heat treatment and that precipitation of excessive silicon atoms increases ohmic contact resistance. It is also known that the use of a barrier layer such as a tungsten silicide ($WSi_x$) film and a molybdenum silicide ($MoSi_x$) film, provides an effective solution for preventing precipitation of silicon atoms. Usually, such a barrier layer is provided so as to underlie an aluminum-silicon alloy film, or cover an exposed surface of a silicon substrate in a contact hole.

On the other hand, the use of the barrier layer may lead to an increased number of manufacturing steps of the memory device as well as a decrease of the yield rate. Therefore, the memory device which employs the barrier layer may be expensive.

Generally, electric characteristics of a conventional semiconductor memory device are not greatly affected by precipitation of silicon. In other words, excessive silicon atoms do not precipitate greatly in a contact hole having a normal size obtainable by conventional photolithography technology. Therefore, some marketed semiconductor memory devices do not have the barrier layer. However, as described later, precipitation of silicon atoms increases as a contact area where the aluminum-silicon alloy film is in contact with the substrate decreases. Therefore, an economical solution which can provide a low-resistance ohmic contact without additional steps nor a decrease of the yield rate is desired.

SUMMARY OF THE INVENTION

It is therefore a general object of the present invention to provide a novel and useful semiconductor memory device having an ohmic contact between an aluminum-silicon alloy metallization film and a silicon substrate, in which the aforementioned disadvantages are eliminated.

A more specific object of the present invention is to provide a semiconductor memory device in which precipitation of silicon in an aluminum-silicon alloy metallization film can be effectively prevented by a barrier layer which can be formed without additional production steps nor a decrease of the yield rate.

The above objects of the present invention are achieved by a semiconductor memory device which includes a memory cell portion and a peripheral circuit portion which are provided on a silicon substrate. The memory cell portion comprises a first insulation film formed on the silicon substrate; and a first metallization film formed on the first insulation film. The first metallization film includes a polysilicon film and a metal silicide film which are stacked in this sequence. The peripheral circuit portion includes a second insulation film having a contact hole formed on the silicon substrate; a barrier layer formed in the contact hole having a layer structure which is the same as that of the first metallization film and which is formed at the same time as forming the first metallization film; and a second metallization film of an alloy of aluminum and silicon which overlies the barrier layer in the contact hole.

Another object of the present invention is to provide a semiconductor memory device having a good ohmic contact between a silicon substrate and an aluminum-silicon alloy metallization, in which a contact hole is extremely fine.

The above another object of the present invention is achieved by a semiconductor memory device which includes a memory cell portion and a peripheral circuit portion which are provided on a silicon substrate. The memory cell portion includes a first field insulation film formed on the substrate; a first insulation film formed on the silicon substrate and the first field insulation film; and a first metallization film formed on the first insulation film. The first metallization film includes a polysilicon film and a metal silicide film which are stacked in this sequence. The peripheral circuit portion includes a second field insulation film formed on the substrate and the second insulation film; a second insulation film having a contact hole formed on the silicon substrate; a barrier layer formed in the contact hole having a layer structure which is the same as that of the first metallization film and which is formed at the same time as forming the first metallization film; and a second metallization film of an alloy of aluminum and silicon which overlies the barrier layer in the contact hole. An edge of the contact hole extending in a first direction is defined by an edge of the second insulation film, and an edge of the contact hole extending in a second direction is defined by patterning the second insulation film.

Other objects, features and advantages of the present invention will become apparent from the following detailed description when read in conjunction with the accompanying drawings.

BRIEF DESCRIPTION OF THE DRAWINGS

FIG. 2 is a plan view of a semiconductor memory device of a preferred embodiment of the present invention;

FIG. 3A is a cross sectional view showing a layer structure in a peripheral circuit portion of the semiconductor memory device of the preferred embodiment;

FIG. 3B is a cross sectional view showing a layer structure in a memory cell portion of the semiconductor memory device of the preferred embodiment.

DETAILED DESCRIPTION

Figure 1:
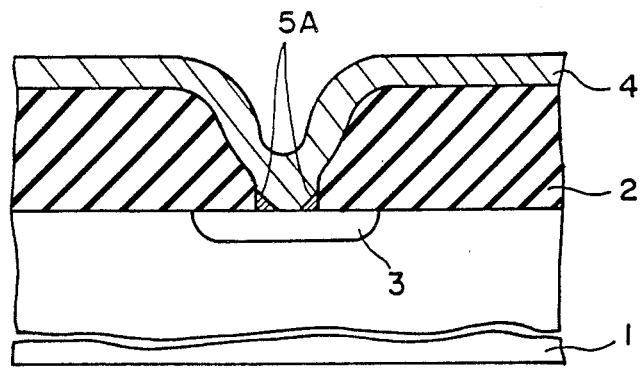
FIG. 1 is a cross sectional view of a conventional semiconductor memory device.

A description is given of precipitation of silicon in an alloy of aluminum and silicon with reference to FIG. 1.

Referring to FIG. 1, the illustrated semiconductor device comprises a silicon substrate 1, a field insulation film 2 such as a silicon dioxide ($SiO_2$) film, an impurity-diffusion region 3 and an electrode/interconnection metallization layer 4 made of an alloy of aluminum and silicon. Generally, in a case where the Al—Si alloy metallization film 4 is used, excessive silicon atoms 5 may precipitate at a corner portion of the Al—Si metallization film 5 in a contact hole formed in the field insulation film 2. If precipitation of silicon atoms occurs greatly, silicon atoms may precipitate on the entire surface of the impurity-diffusion region 3 which is exposed through the contact hole. As a result, the contact resistance between the impurity-diffusion region 3 and the Al—Si alloy metallization film 4 increases greatly.

In order to overcome the above problem, the use of the barrier layer is proposed, as described before. However, the use of the barrier layer leads to additional manufacturing steps and a decrease of the yield rate.

According to the present invention, a barrier layer to an Al—Si alloy metallization film provided in a peripheral circuit portion of a semiconductor memory device is formed by utilizing a metallization film which has the same layer structure as a metallization film of a bit line provided in a memory cell portion of the semiconductor memory device. In other words, the barrier layer provided by the present invention is formed at the same time as forming the bit line provided in the memory cell portion of the semiconductor memory device.

Recently, in a dynamic random access memory device (hereinafter simply referred to as a DRAM device), a bit line provided in a memory cell array is used which is constructed by a stacked layer consisting of an impurity-doped polysilicon film and a metal silicide film. The reason why such a bit line is employed in DRAM devices is as follows. In a case where aluminum (Al) is used as a material of a bit line, it is necessary to form a considerably thick bit line pattern in order to obtain resistance to electromigration. However, the thick bit line may cause an increase of parasitic capacitance between neighboring bit lines, which may cause a decrease of a switching speed of the device. Additionally, increased noise is caused. Therefore in place of the aluminum bit line, a bit line consisting of a polysilicon film and a metal silicide film is employed in the DRAM. It is noted that the bit line consisting of the polysilicon film and the metal silicide film has a wiring resistance value lower than that of a polysilicon film itself.

Similarly, a conventional static random access memory device (a SRAM device) also employs a similar wiring layer structure to form a ground-side power supply line (a Vss line). This is because with the wiring layer structure consisting of the impurity-doped polysilicon film and the metal silicide film, it becomes possible to reduce a memory cell area, compared with a case in which the Vss line is made of a material identical to a material used for forming a gate electrode or a diffusion region. In addition, the switching speed can be improved.

As described above, currently, there is a tendency for a metallization film such as a bit line provided in a memory cell portion of the memory device to be formed with an impurity-doped polysilicon film and a metal silicide film. On the other hand, generally, a wiring line or an electrode provided in a peripheral circuit portion is made by an alloy of aluminum and silicon. .

The present invention utilizes the above-mentioned metallization provided in the memory cell portion in order to form a barrier layer with respect to an aluminum-silicon alloy metallization film provided in the peripheral portion of the semiconductor memory device.

A description is given of a preferred embodiment of the present invention with reference to FIGS. 2, 3A and 3B.

Referring to FIG. 2, a semiconductor memory device comprises four identical blocks 100, 200, 300 and 400, and another block 500. Each of the blocks 100, 200, 300 and 400 includes two memory cell arrays 110 and 111, two sense amplifiers 112 and 113, two column decoders 114 and 115, and two row decoders 116 and 117. The block 500 is a logic circuit which includes inverters and so on. Each of the memory cell arrays 110 and 111 has a plurality of memory cells which are arranged in the form of a matrix. An address signal supplied to an external circuit such as a central processing unit (CPU) is supplied to pads 120 through terminal pins (not shown) and the logic circuit 500, and is then supplied to the column decoders 114 and 115, and the row decoders 116 and 117. Data supplied from the external circuit through pads 120 can be written into the memory cell arrays 110 and 111. Data stored in the memory cell arrays 110 and 111 may be read out and passes through the respective sense amplifiers 112 and 113 and the logic circuit 500. Then the read-out data is supplied to the external circuit through pads 120 and terminal pins (not shown).

In the present specification, a memory cell portion of the semiconductor memory device contains the memory cell arrays 110 and 111 of each of the blocks 100, 200, 300 and 400. On the other hand, a peripheral circuit portion of the semiconductor memory device contains sense amplifiers 112 and 113, the column decoders 114 and 115, the row decoders 116 and 117, and the logic circuit 500.

The peripheral circuit portion has an element, the cross section of which is shown in FIG. 3A. The memory cell portion has an element, the cross section of which is shown in FIG. 3B.

Referring to FIGS. 3A and 3B, a photoresist film which covers active regions in a p-type silicon substrate 11 is formed by a resist process employed in the conventional photolithography technology. Thereafter, boron (B) ions are implanted into the active regions by ion implantation. Thereby an element separation region (not shown) is formed. Then the photoresist film is removed, and then field insulation films 12 are formed by a conventional selective thermal oxidation process, in which a silicon nitride ($Si_3N_4$) film or the like is used as an oxidation-resistant mask. Then, a gate insulation film 13 such as a silicon dioxide ($SiO_2$) film having a thickness of approximately 200 [Å] is formed by thermal oxidation. Thereafter, a polysilicon film is deposited to a thickness of approximately 2000 [Å] by chemical vapor deposition (CVD). Then the deposited polysilicon film is patterned by the conventional photolithography technology. Thereby, gate electrodes $14_1$, $14_2$ and 25 are formed. By ion implantation, arsenic (As) ions are implanted into the substrate 11, and thereby $n^+$-type source regions 15 and 26, and $n^+$-type drain regions 16 and 27 are formed. The source region 15 is a bit line contact region, and the drain region 16 is a contact region to a storage electrode 18 of a memory cell capacitor. The combination of the gate electrode $14_1$, the source region 15 and the drain region 16 construct a transfer gate transistor of the illustrated memory cell.

On the other hand, the combination of the gate electrode 25, the source region 26 and the drain region 27 construct a transistor provided in the peripheral circuit portion.

Subsequently, an interlayer insulation film 17 such as a silicon dioxide ($SiO_2$) film is deposited to a thickness of approximately 1000 [Å] by chemical vapor deposition. Thereafter, the interlayer insulation film 17 is subjected to a patterning process by anisotropic etching due to a resist process employed in the conventional photolithography technology. In anisotropic etching, an etching gas which contains $CHF_3+H_2$ is used. Thereby, a contact hole 32 is formed in the interlayer insulation film 17. Thereafter, a polysilicon film is deposited to a thickness of about 2000 [Å] by chemical vapor deposition. Then the deposited polysilicon film is patterned by the conventional photolithography technology. Thereby, the storage electrode 18 is formed. The storage electrode 18 is one of paired electrodes of a memory cell capacitor. The storage electrode 18 is in ohmic contact with the drain region 16. Thereafter, a silicon dioxide film is formed by thermal oxidation so as to cover an exposed surface of the storage electrode 18. The silicon dioxide film thus formed functions as a dielectric film of the memory cell capacitor. Since the silicon dioxide film has a thin thickness of approximately 100 [Å], it is not shown in FIG. 3B.

Then a polysilicon film is deposited to a thickness of about 2000 [Å] by chemical vapor deposition. Then the deposited polysilicon film is subjected to the patterning process based on the conventional photolithography technology. Thereby an opposed electrode 19 is formed as shown in FIG. 3B. The opposed electrode 19 is the other electrode of the memory cell capacitor, and is called a cell plate.

An interlayer insulation film 20 of silicon dioxide is deposited to a thickness of about 2500 [Å] by chemical vapor deposition. Then the interlayer insulation films 17 and 20 are subjected to anisotropic etching based on the resist process of the conventional photolithography technology and reactive etching in which an etching gas of $CHF_3+H_2$ is used. By anisotropic etching, a layer portion from the top surfaces of the interlayer insulation films 17 and 20 to the surface of the substrate 11 are removed, and thereby contact holes 31, 33 and 34 are formed.

Then a polysilicon film is grown to a thickness of approximately 1000 [Å] by chemical vapor deposition. Subsequently, a tungsten silicide ($WSi_2$) film having a thickness of approximately 2000 [Å] is formed by sputtering. Then, the polysilicon film and the tungsten silicide film are patterned by the conventional photolithography technology. Thereby, a bit line 40 consisting of the patterned polysilicon film 21 and tungsten silicide film 22, is formed. The bit line 40 is in ohmic contact with the source region 15. At the same time, barrier layers 50 and 60 are formed, each of which consists of the patterned polysilicon film 21 and tungsten silicide film 22. The patterned polysilicon film 21 of the barrier layer 50 is in contact with the source region 26, and the patterned polysilicon film 21 of the barrier layer 60 is in contact with the drain region 27.

It is noted that the barrier layers 50 and 60 provided in the peripheral circuit portion can be formed at the same time as the bit line 40 in the memory cell portion is formed. In other words, no additional step is necessary to form the barrier layers 50 and 60.

The tungsten silicide film 22 can be replaced with other refractory metal silicides such as molybdenum silicide ($MoSi_2$), tantalum silicide ($TaSi_2$) and titanium silicide ($TiSi_2$). The impurity doping process may be carried out after the deposition of the tungsten silicide film 22. After depositing tungsten silicide film 22, a mask film is deposited, and the tungsten silicide film 22 is doped with an n-type impurity such as arsenic (As). Thereby the polysilicon film 21 of each of the bit lines 40 and the barrier layers 50 and 60 are changed to $n^+$-type polysilicon films. The MOS transistor which includes the source and drain regions 33 and 34 is an n-channnal transistor. Then the resist mask film is removed, and another resist mask film is deposited. This resist mask film is used for forming a p-channel MOS transistor. After forming the resist mask film, the polysilicon film 21 associated with a p-channel MOS transistor is doped with a p-type impurity such as boron (B). Thereby the above polysilicon film 21 is changed to a $p^+$-type polysilicon film. Then, the aforementioned patterning process may be carried out.

Thereafter, an insulation film 23 such as a phosphosilicate glass (PSG) film and a silicon dioxide ($SiO_2$) film is formed on the entire surface of the stacked layer. Then the insulation film 23 is etched to form through holes 37 therein. Then an aluminum-silicon alloy film is formed on the entire surface of the insulation film 23 and is then subjected to patterning. Thereby word lines 24 in the memory cell circuit portion and wiring lines 29 and 30 in the peripheral circuit portion are formed.

The present invention is most advantageous to a semiconductor memory device described below. It is well known that reduction in size of a metallization pattern is an effective means for improving the integration density of semiconductor memory devices. Fine patterns can be achieved by reduction in size of a contact hole. There is a limit on the available minimum size of a contact hole by the conventional photolithography, which is necessarily determined depending on a minimum pattern width and alignment accuracy.

In order to obtain a reduced size of the contact hole, the present inventor has proposed an improved contact hole structure. The proposal utilizes a bird's beak of a field insulation layer to define an edge of a contact hole or a contact area in a direction in which a very high alignment accuracy is required. With the proposed contact hole structure, it becomes possible to obtain a reduced electrode pitch or wiring line pitch, which cannot be obtained by the conventional photolithography technology. However, reduction in size of a contact hole leads to reduction of a contact area on a surface of the substrate, and that there is a tendency for contact resistance to increase with a decrease of the contact area due to precipitation of silicon atoms.

Figure 4:
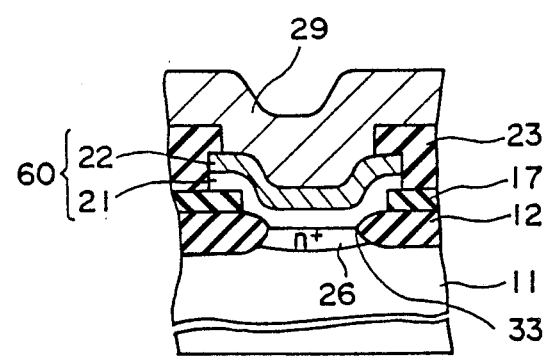
FIG. 4 is a cross sectional view of a portion of the later structure taken along a direction orthogonal to the cross section of FIG. 3B.

FIG. 4 is a cross sectional view showing a layer structure in a vicinity of the contact hole 33 of FIG. 3A, taken along the short-side direction of the chip of FIG. 2. It will be seen from FIG. 4 that edges of the contact hole 33 are defined by edges of the filed insulation film 12. Such edges of the field insulation film 12 are called bird's beaks. An exposed silicon surface defined by the edges of the field insulation film 12 has a length shorter than that defined by edges of the interlayer insulation film 17 shown in FIG. 3A. With the above-mentioned contact hole, it becomes possible to form the contact hole having a size in the short-side direction of the chip smaller than that in the long-side direction. As a result, the pitch in the short-side direction can be reduced. The present invention is advantageous particularly to a semiconductor memory device having the above-mentioned fine contact hole or contact area.

As described above, the presence of the barrier layer 50 and 60 can prevent precipitation of silicon atoms in the aluminum-silicon alloy wiring lines 29 and 30. It is particularly noted that the barrier layer 50 and 60 can be formed at the same time as forming the bit line 40.

The present invention is not limited to DRAM devices and contains SRAM devices and the like.

The present invention is not limited to the embodiments, and variations and modifications may be made without departing from the scope of the present invention.

What is claimed is:

1. A semiconductor memory device comprising a memory cell portion and a peripheral circuit portion which are provided on a silicon substrate,
the memory cell portion comprising a first insulation film formed on the silicon substrate; and a first metallization film formed on the first insulation film, the first metallization film including a polysilicon film and a metal silicide film which are stacked in this sequence,
the peripheral circuit portion comprising a second insulation film having a contact hole formed on the silicon substrate; a barrier layer formed in the contact hole having a layer structure which is the same as that of the first metallization film and which is formed at the same time as forming the first metallization film; and a second metallization film of an alloy of aluminum and silicon which overlies the barrier layer in the contact hole.

2. A semiconductor memory device as claimed in claim 1, wherein the memory cell portion comprises a memory cell array which includes a plurality of memory cells.

3. A semiconductor memory device as claimed in claim 2, wherein the peripheral circuit portion comprises sense amplifier means for amplifying an information signal read out from the memory cell array, address decoder means for decoding an address signal supplied from an external circuit, and logic means for carrying out a logic operation on a signal supplied from the sense amplifier means or supplied to the decoder means.

4. A semiconductor memory device as claimed in claim 1, wherein the metal silicide film included in each of the first metallization film and the barrier layer comprises a refractory metal silicide.

5. A semiconductor memory device as claimed in claim 4, wherein the metal silicide film comprises a material selected from the group consisting of tungsten silicide, molybdenum silicide, tantalum silicide and titanium silicide.

6. A semiconductor memory device as claimed in claim 1, wherein the polysilicon film included in each of the first metallization film and the barrier layer is doped with an n-type impurity.

7. A semiconductor memory device as claimed in claim 1, wherein the semiconductor memory device is a dynamic random access memory device, and wherein the first metallization film is a bit line of the dynamic random access memory device.

8. A semiconductor memory device as claimed in claim 1, further comprising a third insulation film formed on which the second metallization film is formed, and wherein the third insulation film has a through hole through which the barrier layer is exposed, and the second metallization film overlies the barrier layer in the through hole, and wherein the third insulation film also cover the first metallization film.

9. A semiconductor memory device comprising a memory cell portion and a peripheral circuit portion which are provided on a silicon substrate,
the memory cell portion comprising a first field insulation film formed on the substrate; a first insulation film formed on the silicon substrate and the first field insulation film; and a first metallization film formed on the first insulation film, the first metallization film including a polysilicon film and a metal silicide film which are stacked in this sequence,
the peripheral circuit portion comprising a second field insulation film formed on the substrate and the second insulation film; a second insulation film having a contact hole formed on the silicon substrate; a barrier layer formed in the contact hole having a layer structure which is the same as that of the first metallization film and which is formed at the same time as forming the first metallization film; and a second metallization film of an alloy of aluminum and silicon which overlies the barrier layer in the contact hole,
an edge of the contact hole extending in a first direction being defined by an edge of the second field insulation film, and an edge of the contact hole extending in a second direction being defined by patterning the second insulation film.

10. A semiconductor memory device as claimed in claim 1, wherein the second direction is the same direction as the second metallization film extends, and the first direction is perpendicular to the second direction.

* * * * *

UNITED STATES PATENT AND TRADEMARK OFFICE
CERTIFICATE OF CORRECTION

PATENT NO. : 4,931,845
DATED : June 5, 1990
INVENTOR(S) : Taiji EMA

It is certified that error appears in the above-identified patent and that said Letters Patent is hereby corrected as shown below:

Col. 6, line 59, change "filed" to --field--.

Col. 8  line 20, change "cover" to --covers--.

Signed and Sealed this

Thirty-first Day of March, 1992

Attest:

HARRY F. MANBECK, JR.

*Attesting Officer*          *Commissioner of Patents and Trademarks*